United States Patent
Choi et al.

(10) Patent No.: US 8,294,134 B2
(45) Date of Patent: *Oct. 23, 2012

(54) PHASE CHANGE MEMORY DEVICES HAVING A CURRENT INCREASE UNIT

(75) Inventors: Hyuk-soon Choi, Seongnam-si (KR); Ji-hyun Hur, Yongin-si (KR); Yoon-ho Kang, Yongin-si (KR); Hyo-sug Lee, Suwon-si (KR); Jai-kwang Shin, Anyang-si (KR); Jae-joon Oh, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/926,444

(22) Filed: Nov. 18, 2010

(65) Prior Publication Data

US 2011/0068317 A1      Mar. 24, 2011

Related U.S. Application Data

(63) Continuation of application No. 12/000,641, filed on Dec. 14, 2007, now Pat. No. 7,910,913.

(30) Foreign Application Priority Data

Dec. 19, 2006   (KR) ................... 10-2006-0130442

(51) Int. Cl.
    *H01L 47/00*       (2006.01)
(52) U.S. Cl. .. 257/5; 257/2; 257/3; 257/4; 257/E45.002; 257/E27.004; 257/E29.17; 365/163

(58) Field of Classification Search ............... 257/1–5, 257/E45.004, E29.17, E27.004, E45.002; 365/163
See application file for complete search history.

(56) References Cited

U.S. PATENT DOCUMENTS

| | | | |
|---|---|---|---|
| 6,586,761 B2 | 7/2003 | Lowrey | |
| 7,037,749 B2 | 5/2006 | Horii et al. | |
| 7,321,130 B2 | 1/2008 | Lung | |
| 7,432,206 B2 | 10/2008 | Lung | |
| 7,728,319 B2 * | 6/2010 | Goux et al. | 257/3 |
| 7,910,913 B2 * | 3/2011 | Choi et al. | 257/5 |
| 2007/0018149 A1 | 1/2007 | Sato | |
| 2007/0108429 A1 | 5/2007 | Lung | |

FOREIGN PATENT DOCUMENTS

KR     2004-0083144     10/2004

OTHER PUBLICATIONS

Korean Office Action dated Jun. 5, 2008.

* cited by examiner

*Primary Examiner* — Shouxiang Hu
(74) *Attorney, Agent, or Firm* — Harness, Dickey & Pierce, P.L.C.

(57) ABSTRACT

A phase change memory device includes a switching device and a storage node connected to the switching device. The storage node includes a bottom stack, a phase change layer disposed on the bottom stack and a top stack disposed on the phase change layer. The phase change layer includes a unit for increasing a path of current flowing through the phase change layer and reducing a volume of a phase change memory region. The area of a surface of the unit disposed opposite to the bottom stack is greater than or equal to the area of a surface of the bottom stack in contact with the phase change layer.

17 Claims, 15 Drawing Sheets
(3 of 15 Drawing Sheet(s) Filed in Color)

PHASE CHANGE MEMORY DEVICES HAVING A CURRENT INCREASE UNIT

CROSS-REFERENCE TO RELATED APPLICATIONS

This non-provisional U.S. patent application is a Continuation of, and claims priority under 35 U.S.C. §120 to, U.S. application Ser. No. 12/000,641, filed on Dec. 14, 2007 now U.S. Pat. No. 7,910,913, which claims priority under 35 U.S.C. §119 to Korean Patent Application No. 10-2006-0130442, filed on Dec. 19, 2006, in the Korean Intellectual Property Office, the entire contents of each of these applications are incorporated herein by reference.

BACKGROUND

Description of the Related Art

A conventional phase change memory device (such as a phase change random access memory (PRAM)) may include a storage node having a phase change material layer and a transistor connected to the storage node. When a reset current is applied to the phase change memory device, a region in contact with a bottom electrode contact layer of the phase change material layer may be heated to a temperature higher than a melting point of the phase change material layer. As a result, the region in contact with the bottom electrode contact layer may become amorphous. The amorphous region may be changed into a crystalline region by applying a set current to the storage node.

An amorphous region of the phase change material layer may have a higher resistance than other regions of the phase change material layer. As a result, the value of a current passing through the phase change material layer may depend on whether or not an amorphous region exists in the phase change material layer. In one example, when the amorphous region is present in the phase change material layer, a current supplied to the phase change material layer may be smaller than a reference current, and a data "1" may be read from the PRAM. Conversely, when the amorphous region is not present in the phase change material layer, a current passing through the phase change material layer may be larger than the reference current, and a data "0" may be read from the PRAM. Opposite standards may be used in deciding whether data "1" or data "0" is read from the PRAM.

As integration density of conventional semiconductor memory devices increases, transistor size should decrease. As a result, the maximum sustainable current in the transistor may also decrease. In conventional phase change memory devices, a reset current and a set current may be supplied through the transistor. The reset current may be larger than the set current. When transistor size is reduced, the reset current may decrease so that the smaller transistor may sustain the reset current.

SUMMARY

Example embodiments relate to phase change memory devices, methods of manufacturing and methods of operating the same. Phase change memory devices according to example embodiments may include an expanded current path, a reduced memory region and/or reduced program volume, methods of manufacturing and methods of operating the same.

Example embodiments provide phase change memory devices, which may have increased integration density by reducing a reset current. Example embodiments may suppress and/or prevent data loss due to external heat.

At least one example embodiment provides a phase change memory device including a switching device and a storage node connected to the switching device. The storage node may include a bottom stack, a phase change layer disposed on the bottom stack, and a top stack disposed on the phase change layer. The phase change layer may include a current path increase unit for increasing a path of current flowing through the phase change layer. The current path increase unit may also reduce a volume of a phase change memory region.

According to example embodiments, an area of a surface of the current path increase unit disposed opposite the bottom stack may be greater than or equal to an area of a surface of the bottom stack in contact with the phase change layer. The current path increase unit may be a material layer having a lower electric conductivity than an amorphous region to be formed in the phase change layer. The material layer may be an insulating layer or a conductive layer. The material layer may have a thickness sufficient to suppress and/or prevent tunnelling of the current flowing through the phase change layer.

According to example embodiments, the phase change layer may include a plurality of material layers stacked vertically and spaced from one another. In this example, the width of at least a portion of the material layers may be different from the width of the other material layers. The storage node may further include a plurality of (e.g., two) material layers stacked vertically between the material layers. The plurality of material layers may be disposed on the same or substantially the same level (e.g., in the same plane) and/or spaced over an underlying material layer.

At least one other example embodiment provides a phase change random access memory (PRAM) including a switching device and a storage node connected to the switching device. The storage node may include a bottom stack, a phase change layer having a trench filled with a material layer, disposed on the bottom stack, a top stack disposed on the phase change layer and the material layer. The trench may be filled with a material layer. The material layer may have an area greater than or equal to an area of a surface of the bottom stack in contact with the phase change layer. The material layer may have lower electric conductivity than an amorphous region to be formed in the phase change layer.

According to at least some example embodiments, the storage node may further include a cylindrical material layer disposed apart from the material layer to enclose the surface of the bottom stack and the material layer. The cylindrical material layer may have lower electric conductivity than the amorphous region to be formed in the phase change layer. The material layer filled in the trench may extend beyond the cylindrical material layer. The material layer filled in the trench may be an insulating layer or a conductive layer. The cylindrical material layer may have the same or substantially the same electric conductivity as the material layer filling the trench. Alternatively, the cylindrical material may have a different electric conductivity than the material layer filled in the trench.

At least one other example embodiment provides a method of manufacturing a memory device (e.g., a PRAM) including a switching device and a storage node connected to the switching device. According to at least this method, a storage node may be formed. For example, a first phase change layer may be formed on an insulating interlayer to cover an exposed surface of a bottom electrode contact layer. A first material layer may be formed on a region of the first phase change layer to cover the exposed surface of the bottom electrode contact layer. A second phase change layer may be formed on the first phase change layer to cover the first material layer. The first material layer may have a lower electric conductivity than an amorphous region formed in the first phase change layer.

According to at least some example embodiments, the first material layer may be an insulating layer or a conductive layer. A second material layer may be formed on the second phase change layer, and a third phase change layer may be formed on the second phase change layer to cover the second material layer. The second material layer may have lower electric conductivity than each of the first through third phase change layers. The second material layer may be formed in a plurality of (e.g., at least two) separate portions. The plurality of portions may be formed apart from each other such that a space between the plurality of portions may be positioned over the first material layer. The second material layer may be formed to have an area greater than or equal to the first material layer.

According to at least some example embodiments, the first and second material layers may have the same, substantially the same or different electric conductivities. The second material layer may be one of an insulating layer and a conductive layer.

At least one other example embodiment provides a method of manufacturing a memory device (e.g., a PRAM) including a switching device and a storage node connected to the switching device. According to at least this method, a storage node may be formed. For example, a phase change layer may be formed on an insulating interlayer to cover an exposed surface of a bottom electrode contact layer. A trench may be formed over the exposed surface of the bottom electrode contact layer in the phase change layer, and the trench may be filled with a material layer. A top stack may be formed on the phase change layer and the material layer. The trench may have a bottom surface with at least the same or substantially the same area as the exposed surface of the bottom electrode contact layer. The material layer may have a lower electric conductivity than an amorphous region formed in the phase change layer.

According to at least some example embodiments, before forming the phase change layer on the insulating interlayer, a cylindrical material layer may be formed on the insulating interlayer to enclose the exposed surface of the bottom electrode contact layer and the trench. The material layer filling the trench may expand beyond the cylindrical material layer. The cylindrical material layer may have lower electric conductivity than the phase change layer. The material filling the trench may have different electric conductivity than the cylindrical material layer. The cylindrical material layer may be one of an insulating layer and a conductive layer.

At least one other example embodiment provides a method of operating a memory device (e.g., a PRAM) including a switching device and a storage node connected to the switching device. According to at least this method, the switching device may be maintained in an on state and an operating voltage may be applied to the storage node. The operating voltage may be one of a write voltage, a read voltage and an erase voltage.

According to at least some example embodiments, when the operating voltage is a read voltage, a current measured in the storage node may be compared with a reference current. The reset current of the memory may be reduced, which may increase integration density of the memory. Furthermore, the insulating layer included in the phase change layer may suppress and/or prevent a program volume (e.g., an amorphous region) of the phase change layer from being arbitrarily changed into a crystalline region due to external agents, such as heat. As a result, loss and/or change of written data may be suppressed and/or inhibited.

BRIEF DESCRIPTION OF THE DRAWINGS

The patent or application file contains at least one drawing executed in color. Copies of this patent or patent application publication with color drawing will be provided by the Office upon request and payment of the necessary fee.

Example embodiments will become more apparent by describing in detail the example embodiments shown in the attached drawings in which.

DETAILED DESCRIPTION OF EXAMPLE EMBODIMENTS

Figure 1:
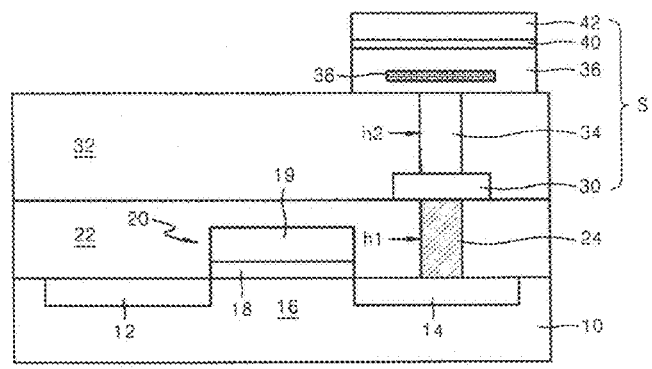
FIG. 1 is a cross-sectional view of a phase change memory device according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Example embodiments of phase change memory devices, methods of manufacturing the same and operating the same will now be described more fully hereinafter with reference to the accompanying drawings. In the drawings, the thicknesses of layers and regions are exaggerated for clarity.

FIG. 1 is a cross-sectional view of a phase change memory device according to an example embodiment.

Referring to FIG. 1, a first impurity region 12 and a second impurity region 14 may be formed apart from each other in a substrate 10. The first and second impurity regions 12 and 14 may be doped with conductivity type impurities, for example, n-type or p-type impurities. One of the first and second impurity regions 12 and 14 may be a source region, while the other may be a drain region. A gate stack 20 may be disposed between the first and second impurity regions 12 and 14 on the substrate 10. A channel region 16 may be disposed under the gate stack 20. The gate stack 20 may include a gate insulating layer 18 and a gate electrode 19 stacked sequentially. The substrate 10 having the first and second impurity regions 12 and 14 and the gate stack 20 may constitute a switching device or transistor.

A first insulating interlayer 22 may be disposed on the substrate 10 to cover the transistor. A first contact hole h1 may be formed in or through the first insulating interlayer 22 to expose the second impurity region 14. The first contact hole h1 may be filled with a conductive plug 24. A bottom electrode 30 may be disposed on the first insulating interlayer 22 to cover at least an exposed surface of the conductive plug 24. For example, bottom electrode 30 may have a size sufficient to cover the exposed portion of the bottom electrode 30, or may have a size larger than the exposed portion of the bottom electrode 30 in at least one direction.

A second insulating interlayer 32 may be stacked on the first insulating interlayer 22 to cover the bottom electrode 30. A second contact hole h2 may be formed in or through the second insulating interlayer 32 to expose a portion of the bottom electrode 30. The second contact hole h2 may be filled with a bottom electrode contact layer 34. The bottom electrode 30 and the bottom electrode contact layer 34 may constitute a bottom stack. The bottom electrode contact layer 34 may be, for example, a TiN layer, a TiAlN layer or the like. The second insulating interlayer 32 may be formed of the same material as the first insulating interlayer 22.

A phase change layer 36 may be disposed on the second insulating interlayer 32 to cover an exposed surface of the bottom electrode contact layer 34. For example, phase change layer 36 may have a size sufficient to cover the exposed surface of the bottom electrode contact layer 34, or may have a size larger than the exposed surface of the bottom electrode contact layer 34 in at least one direction. In at least one example embodiment, the phase change layer 36 may be a GeSbTe (GST) layer or a binary, ternary, or quaternary chalcogenide layer. An insulating layer 38 may be formed in the phase change layer 36. The insulating layer 38 may have a first thickness.

The insulating layer 38 may be, for example, a silicon oxide layer or the like. Alternatively, the insulating layer 38 may be a nitride layer or another insulating material layer. The insulating layer 38 may function as a current path increase unit for increasing (expanding) a path of current flowing through the phase change layer 36. Although the current path increase unit is shown as insulating layer 38 in FIG. 1, the current path increase unit is not limited to the insulating layer 38. For example, any material layer having an electric conductivity lower than that of the phase change layer 36 may function as the current path increase unit. Therefore, the insulating layer 38 may be replaced by any suitable material layer having an electric conductivity lower than that of the phase change layer 36.

Considering that an amorphous region is formed in the phase change layer 36 after a reset current is supplied thereto, the electric conductivity of the insulating layer 38 or the material layer may be lower than that of the amorphous region of the phase change layer 36. The insulating layer 38 may cause a phase change memory region, which may transition into an amorphous region (e.g., a program volume), to narrow to a region between the insulating layer 38 and the bottom electrode contact layer 34. If the program volume narrows in the phase change layer 36, the density of current passing through the program volume may increase more than when the insulating layer 38 is omitted. This may decrease a current required for a memory operation (e.g., a reset current).

The insulating layer 38 may be disposed opposite to the bottom electrode contact layer 34 and the second insulating interlayer 32, but may be disposed adjacent to the bottom electrode contact layer 34. The insulating layer 38 may have a thickness sufficient to suppress and/or prevent tunneling of a reset current applied to the phase change memory device (hereinafter, a reduced or minimum thickness). As a result, if the reset current is reduced, the thickness of the insulating layer 38 may also be reduced. The insulating layer 38 may suppress and/or prevent the program volume of the phase change layer 36 (e.g., the region of the phase change layer 36) changed from a crystalline state to an amorphous state when the reset current is supplied thereto, for example, the region between the insulating layer 38 and the bottom electrode contact layer 34, from being damaged by heat generated during subsequent processes.

Figure 2:
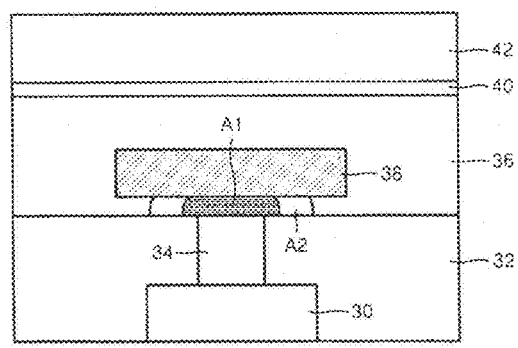
FIG. 2 is a cross-sectional view of the phase change memory device of FIG. 1 in which an amorphous region is formed in a phase change layer.

FIG. 2 is a cross-sectional view of the phase change memory device of FIG. 1 in which an amorphous region is formed in a phase change layer.

Referring to FIG. 2, region A1 may be a region of the phase change layer 36, which may be changed into an amorphous region due to the insulating layer 38. As shown, the region A1 may narrow to a region between the insulating layer 38 and the bottom electrode contact layer 34. Also, if a current supplied from the bottom electrode contact layer 34 to a top electrode 42 bypasses the insulating layer 38 and passes through the phase change layer 36, the current path may expand more than when the insulating layer 38 is omitted. As described above, because the region A1 narrows and the current path expands, the current density and/or resistance of the region A1 may increase. As a result, the energy amount at the region A1 may be greater than or equal to that in the conventional art at a smaller current than in the conventional art. Therefore, a reset current supplied to the phase change layer 36 may be reduced as compared to the conventional art. In FIG. 2, a region A2 refers to a region where a face-centered cubic (FCC) crystal lattice is changed into a hexagonal close-packed (HCP) crystal lattice.

Referring back to FIG. 1, a top stack may be formed on the phase change layer 36. The top stack may include an adhesive layer 40 and a top electrode 42 stacked sequentially. The adhesive layer 40 may be, for example, a Ti layer or the like, and the top electrode 42 may be, for example, a TiN electrode or the like. The bottom stack, the phase change layer 36, and the top stack may constitute a storage node S.

Figure 3:
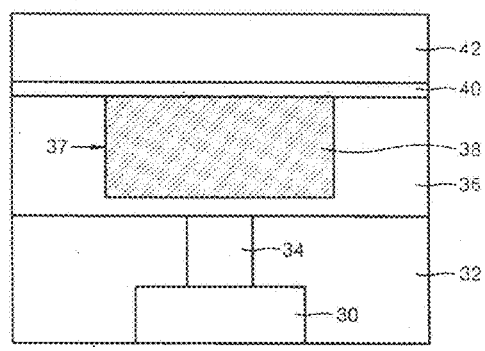
FIG. 3 is a cross-sectional view of a phase change memory device according to another example embodiment.

FIG. 3 is a cross-sectional view of a phase change memory device according to another example embodiment.

Referring to FIG. 3, a trench 37 may be formed to a first depth in the phase change layer 36. The trench 37 may be filled with an insulating layer 38. An adhesive layer 40 may be formed on the phase change layer 36 to cover the insulating layer 38, and a top electrode 42 may be formed on the adhesive layer 40. The remaining elements of a phase change memory device may be the same as the example embodiment shown in FIG. 1.

Figure 4:
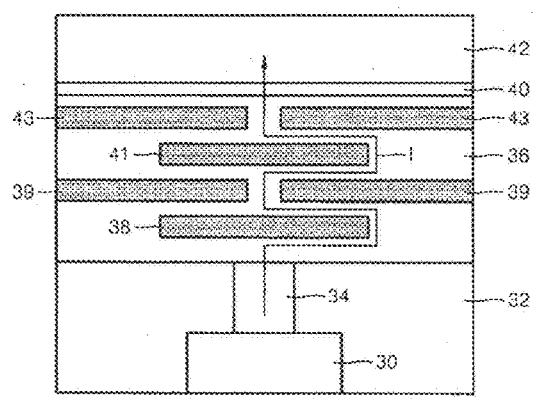
FIG. 4 is a cross-sectional view of a phase change memory device according to another example embodiment.

FIG. 4 is a cross-sectional view of a phase change memory device according to another example embodiment.

Referring to FIG. 4, a plurality of insulating layers 38, 39, 41 and 43 may be formed in a phase change layer 36. The plurality of insulating layers 38, 39, 41 and 43 may be stacked at given intervals in a vertical direction. The insulating layers 38, 39, 41 and 43 may be arranged or configured to expand a path of current flowing between a bottom electrode contact layer 34 and a top electrode 42.

In one example embodiment, two first insulating layers 39 may be spaced apart from each other over the insulating layer 38. In this example, a space between the two first insulating layers 39 may correspond to (e.g., be aligned with) the center of the insulating layer 38. A second insulating layer 41 may be disposed over the first insulating layers 39 in a position corresponding to the insulating layer 38. Two third insulating layers 43 may be arranged in the same manner as the first insulating layers 39. The remaining elements of a phase change memory device may be the same as the example embodiment shown in FIG. 1. As illustrated in FIG. 4, while passing through the phase change layer 36, a current "I" bypasses the insulating layer 38, may pass between the first insulating layers 39, bypass the second insulating layer 41, and pass between the third insulating layers 43.

As described above, a path of the current "I" passing through the phase change layer 36 may expand more than without the plurality of insulating layers 38, 39, 41 and 43. Thus, the resistance of the path of the current "I" may increase more than when the current "I" flows through a linear path. Furthermore, because a region between the insulating layer 38 and the bottom electrode contact layer 34 narrows due to the insulating layer 38, the current density of the region between the insulating layer 38 and the bottom electrode contact layer 34 may increase. Therefore, when the same voltage is applied to the phase change layer 36 as in the conventional art, a reset current required to change the region between the insulating layer 38 and the bottom electrode contact layer 34 into an amorphous region may be reduced as compared to the conventional art.

Figure 5:
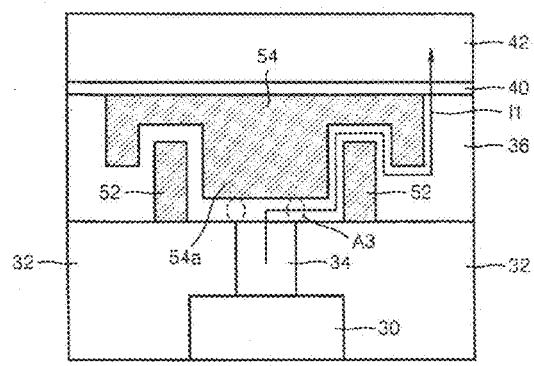
FIG. 5 is a cross-sectional view of a phase change memory device according to another example embodiment.

FIG. 5 is a cross-sectional view of a phase change memory device according to another example embodiment.

Referring to FIG. 5, a first insulating layer 52 and a second insulating layer 54 may be disposed between a second insulating interlayer 32 including a bottom electrode contact layer 34 and an adhesive layer 40. The first insulating layer 52 may be a cylindrical insulating layer spaced apart from the bottom electrode contact layer 34. For example, the first insulating layer 52 may include a first insulating layer portion formed on one side of the bottom electrode contact layer 34, and a second insulating layer portion formed on another side of the bottom electrode contact layer 34. The first insulating layer 52 may enclose the bottom electrode contact layer 34.

The second insulating layer 54 may be formed over the first insulating layer 52, but the second insulating layer 54 may not contact the first insulating layer 52. The second insulating layer 54 may include a middle protrusion portion 54a. The middle protrusion portion 54a may protrude toward the inside of the cylindrical first insulating layer 52 such that the protrusion portion 54a is relatively close to and faces the bottom electrode contact layer 34. The remaining portion of the second insulating layer 54 expands from the protrusion 54a outward to the first insulating layer 52 and then expands toward the second insulating interlayer 32 parallel to an outer surface of the first insulating layer 52. The vertical length of an outer portion of the second insulating layer 54 may be less than an intermediate portion of the second insulating layer 54 (e.g., between the outer portion and the middle protrusion portion), but less than the vertical length of the middle protrusion portion 54a. The horizontal width of the second portion of the second insulating layer 54 may be the same as the horizontal width of the third portion of the second insulating layer 54, but less than the horizontal width of the middle protrusion portion 54a.

A top surface of the second insulating layer 54 may contact the adhesive layer 40. The length of the top surface of the second insulating layer 54 may be less than that of the adhesive layer 40 and/or the top electrode 42. The first and second insulating layers 52 and 54 may be enclosed by the phase change layer 36. Also, the space between the first and second insulating layers 52 and 54 may be filled with the phase change layer 36. The first and second insulating layers 52 and 54 may be formed of the same material as the insulating layer 38 discussed above with regard to the example embodiment shown in FIG. 1. Alternatively, the first and second insulating layers 52 and 54 may be formed of different insulating material. In FIG. 5, for example, a current may flow through a path 11 from the bottom electrode contact layer 34 to a top electrode 42.

Still referring to FIG. 3, for the same reason as described in the previous example embodiments, a region A3 between an edge of the bottom electrode contact layer 34 and the protrusion 54a of the second insulating layer 54 adjacent to the edge of the bottom electrode contact layer 34 may change into an amorphous region at a lower reset current than in the conventional art.

FIGS. 6 through 11 are cross-sectional views for illustrating a method of manufacturing a phase change memory device according to an example embodiment.

Figure 6:
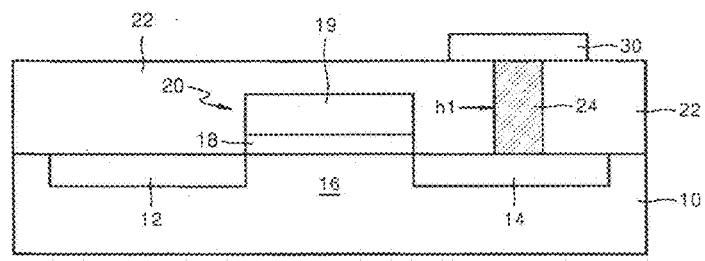
FIGS. 6 through 11 are cross-sectional views for illustrating a method of manufacturing a phase change memory device according to an example embodiment.

Referring to FIG. 6, a gate stack 20 may be formed on a given region of a substrate 10. The gate stack 20 may be obtained by sequentially stacking a gate insulating layer 18 and a gate electrode 19 on the substrate 10. A conductive impurity may be implanted into the substrate 10 using the gate stack 20 as a mask to form first and second impurity regions 12 and 14. The conductive impurity may be, for example, n-type or a p-type impurity. The gate stack 20 may be interposed between the first and second impurity regions 12 and 14. One of the first and second impurity regions 12 and 14 may be a source region, while the other one may be a drain region. The first and second impurity regions 12 and 14 and the gate stack 20 may constitute a transistor, which may be one of a plurality of switching devices. A region disposed under (e.g., directly under) the gate insulating layer 18 of the substrate 10 (e.g., a region between the first and second impurity regions 12 and 14) may serve as a channel region 16.

A first insulating interlayer 22 may be formed on the substrate 10 to cover the transistor. The first insulating interlayer 22 may be formed of a dielectric material, such as, $SiO_X$, $SiO_XN_Y$, or other similar insulating material. A first contact hole h1 may be formed through the first insulating interlayer 22 to expose at least a portion of the second impurity region 14. The first contact hole h1 may be filled with a conductive material to form a conductive plug 24. A bottom electrode 30 may be formed on the first insulating interlayer 22 to cover an exposed surface of the conductive plug 24. The bottom electrode 30 may be formed of TiN, TiAlN or the like. Alternatively, the bottom electrode 30 may be formed of silicide containing ions of a metal selected from the group consisting of or including Ag, Au, Al, Cu, Cr, Co, Ni, Ti, Sb, V, Mo, Ta, Nb, Ru, W, Pt, Pd, Zn, Mg, an alloy thereof and the like.

Figure 7:
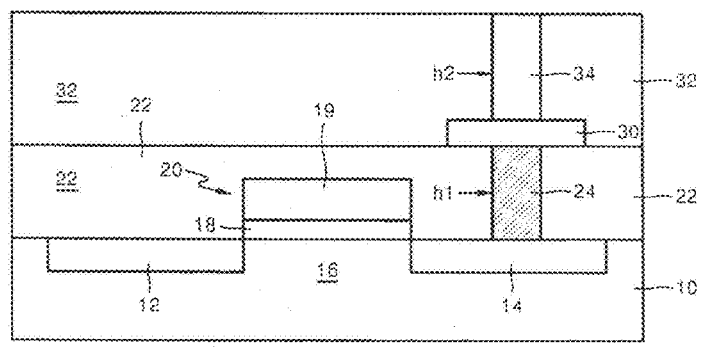

Referring to FIG. 7, a second insulating interlayer 32 may be formed on the first insulating interlayer 22 to cover the bottom electrode 30. The second insulating interlayer 32 may be formed of a dielectric material, such as, $SiO_X$, $SiO_XN_Y$ or the like. A second contact hole h2 may be formed in the second insulating interlayer 32 to partially expose a top surface of the bottom electrode 30. The second contact hole h2 may be filled with TiN, TiAlN or the like to form a bottom electrode contact layer 34.

Figure 8:
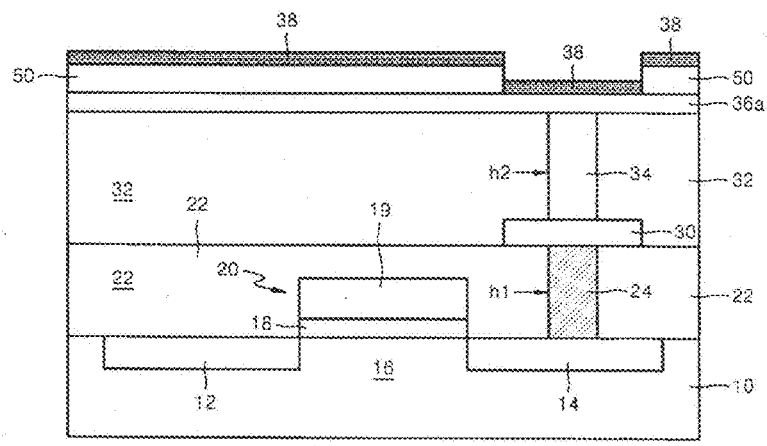

Referring to FIG. 8, a first phase change layer 36a may be formed on the second insulating interlayer 32 to cover at least the top surface of the bottom electrode contact layer 34. The first phase change layer 36a may be formed of, for example, GST or the like. Alternatively, the first phase change layer 36a may be formed of another phase change material, for example, a binary, ternary, or quaternary chalcogenide material. The first phase change layer 36a may be formed to a thickness of several to several tens of nanometers.

A photoresist pattern 50 may be formed on the first phase change layer 36a. The photoresist pattern 50 may be formed to expose a region of the first phase change layer 36a corresponding to the bottom electrode contact layer 34 and a portion of the second insulating interlayer 32 around the bottom electrode contact layer 34. An insulating layer 38 may be formed on the photoresist pattern 50 to cover an exposed region of the first phase change layer 36a. The insulating layer 38 may be formed of silicon oxide or other similar insulating material such as nitride or the like. The insulating layer 38 may be formed to the above-described thickness or more. The insulating layer 38 may be formed to a smaller thickness based on a reset current to be supplied to the phase change memory device. The insulating layer 38 may be replaced by a material layer having any suitable material having an electric conductivity lower than that of the first phase change layer 36a. Thus, the material layer may be an insulating layer or a conductive layer. In one example, the material layer may have an electric conductivity lower than that of an amorphous region to be formed in the first phase change layer 36a. The above description regarding the material layer may refer to any insulating layer to be formed in a phase change layer as described later.

Figure 9:
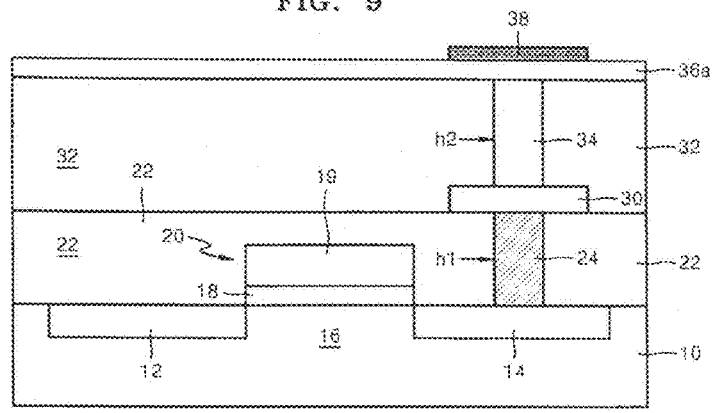

Referring to FIG. 9, the photoresist pattern 50 and a portion of the insulating layer 38 formed on the photoresist pattern 50 may be removed (e.g., simultaneously) using any suitable lift-off or removal process. A portion of the insulating layer 38 may remain on a portion of the first phase change layer 36a as illustrated in FIG. 9. The remaining insulating layer 38 may be formed on a portion of the first phase change layer 36a corresponding to the bottom electrode contact layer 34 and a portion of the second insulating interlayer 32 disposed around the bottom electrode contact layer 34 with the first phase change layer 36a interposed there between.

Figure 10:
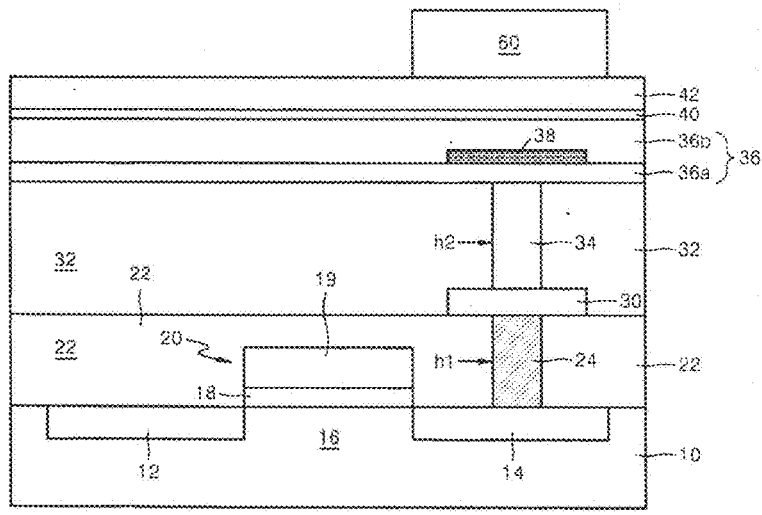

Referring to FIG. 10, a second phase change layer 36b may be formed on the first phase change layer 36a to cover the insulating layer 38. The second phase change layer 36b may be formed of the same phase change material as the first phase change layer 36a. A top surface of the second phase change layer 36b may be planarized, and an adhesive layer 40 and a top electrode 42 may be sequentially formed on the planarized surface of the second phase change layer 36b. The adhesive layer 40 may be formed of, for example, Ti or the like, while the top electrode 42 may be formed of, for example, TiN, TiAlN or the like.

Figure 11:
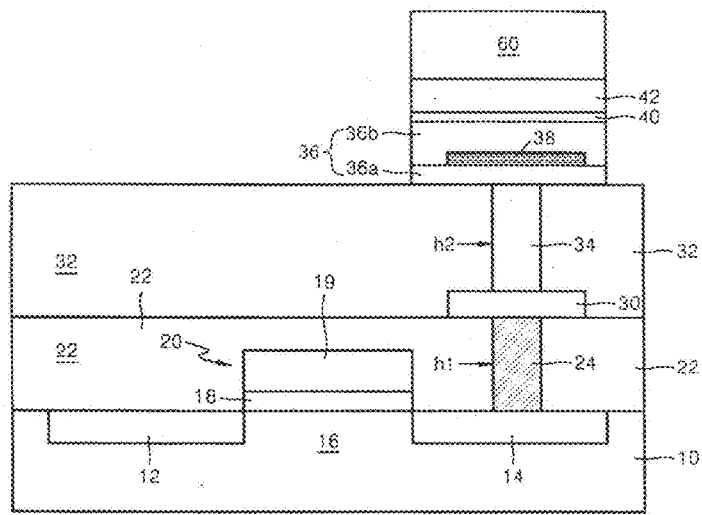

A photoresist pattern 60 may be formed on the top electrode 42. In this example, the photoresist pattern 60 may be formed on a portion of the top electrode corresponding to the insulating layer 38 and a portion of the first phase change layer 36a disposed around the insulating layer 38. The top electrode 42 may be etched using the photoresist pattern 60 as an etch mask. The etching process may be sequentially performed on the adhesive layer 40 and the second and first phase change layers 36b and 36a to expose the second insulating interlayer 32. As a result, as illustrated in FIG. 11, a phase change layer 36, the adhesive layer 40, and the top electrode 42, each having the same shape as the photoresist pattern 60, may be formed on the second insulating interlayer 32. The phase change layer 36, the adhesive layer 40 and the top electrode 42 may constitute a storage node along with the bottom electrode 30 and the bottom electrode contact layer 34. The photoresist pattern 60 may be removed after etching.

The formation of a second contact hole h2 in a second insulating interlayer 32 and the formation of a bottom electrode contact layer 34 in the second contact hole h2 may be the same as described with reference to FIG. 7.

Figure 12:
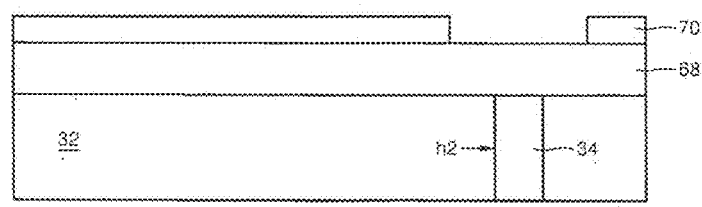
FIGS. 12 through 16 are cross-sectional views for illustrating a method of manufacturing a phase change memory device according to another example embodiment.

FIGS. 12 through 16 are cross-sectional views for illustrating a method of manufacturing a phase change memory device according to another example embodiment;

Referring to FIG. 12; a first phase change layer 68 may be formed on the second insulating interlayer 32 to cover an exposed surface of the bottom electrode contact layer 34. In this example embodiment, the first phase change layer 68 may be formed to a thickness greater than the first phase change layer 36a described above. A photoresist pattern 70 may be formed on the first phase change layer 68 to expose a region of the first phase change layer 68. The exposed region of the first phase change layer 68 may correspond to the bottom electrode contact layer 34 and a portion of the second insulating interlayer 32 disposed around the bottom electrode contact layer 34.

Figure 13:
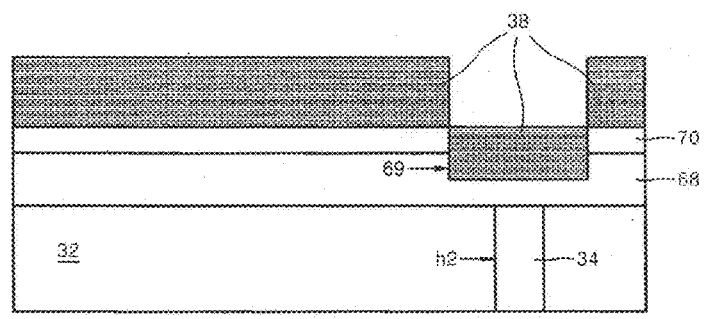
Figure 14:
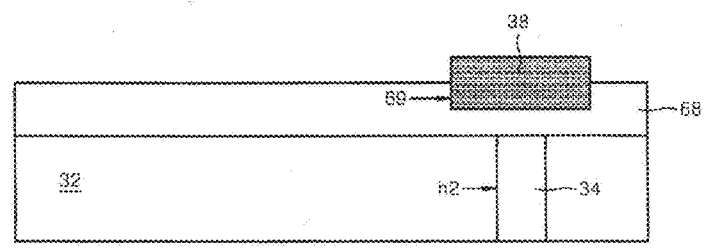

Referring to FIG. 13, the exposed region of the first phase change layer 68 may be etched using the photoresist pattern 70 as an etch mask to form a trench 69 having a depth, which protrudes into the first phase change layer 68. An insulating layer 38 may be formed on the photoresist pattern 70 to fill the trench 69. The insulating layer 38 may be formed of the same material as described above. The photoresist pattern 70 and the insulating layer 38 formed thereon may be removed (e.g., simultaneously) using any suitable removal or lift-off process. As a result, as illustrated in FIG. 14, the remaining insulating layer 38 may fill the trench 69 and protrude from the first phase change layer 68 to a thickness. A top surface of the remaining insulating layer 38 may be planarized until a top surface of the first phase change layer 68 is exposed.

Figure 15:
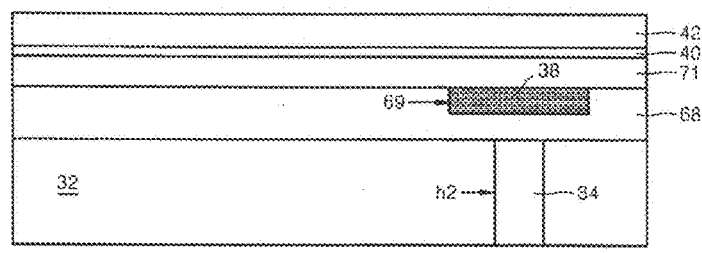

Referring to FIG. 15, a second phase change layer 71 may be formed on the first phase change layer 68 to cover the planarized top surface of the insulating layer 38. The second phase change layer 71 may be formed of the same, substantially the same or a different phase change material as the first phase change layer 68. By forming the second phase change layer 71, the insulating layer 38 may be sandwiched in a phase change layer including the first and second phase change layers 68 and 71. An adhesive layer 40 and a top electrode 42 may be formed on the second phase change layer 71. Thereafter, a photoresist pattern 60 may be formed as described above with reference to FIG. 10, and a stacked structure formed on the second insulating interlayer 32 may be etched using the photoresist pattern 60 as an etch mask as described above with reference to FIG. 11.

Figure 16:
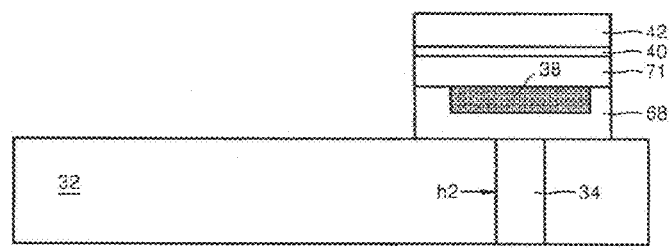

As a result, as illustrated in FIG. 16, a stacked structure including the phase change layer 68 and 71, the adhesive layer 40, and the top electrode 42 may be formed on the second insulating interlayer 32. The phase change layer 68 and 71, in which the insulating layer 38 may be sandwiched, may contact the exposed surface of the bottom electrode contact layer 34. The stacked structure may constitute a storage node along with the bottom electrode contact layer 34.

Because the processes performed until forming a bottom electrode contact layer 34 on a second insulating interlayer 32 may be the same as the above-described example embodiments, the detailed description of those portions of the following example embodiments begin with subsequent processes.

Figure 17:
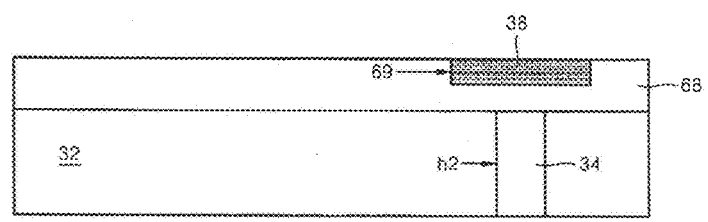
FIGS. 17 and 18 are cross-sectional views for partially illustrating a method of manufacturing a phase change memory device according to another example embodiment.
Figure 18:
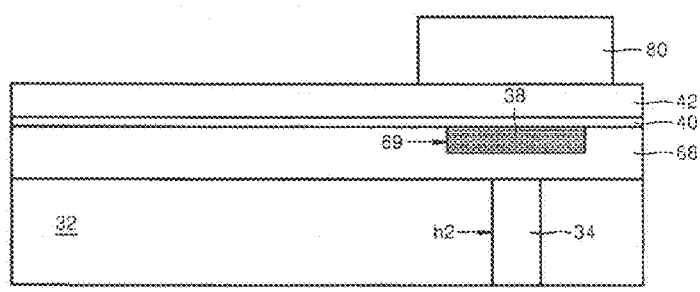

FIGS. 17 and 18 are cross-sectional views for partially illustrating a method of manufacturing a phase change memory device according to another example embodiment.

Referring to FIG. 17, a first phase change layer 68 may be formed on the second insulating interlayer 32 to cover a top surface of the bottom electrode contact layer 34. A trench 69 may be formed to a depth extending into the first phase change layer 68. The trench 69 may be formed opposite to the bottom electrode contact layer 34 and a portion of the second insulating interlayer 32 disposed around the bottom electrode contact layer 34. For example, the trench 69 may be formed in a portion of the first insulating layer 68 corresponding to the bottom electrode contact layer 34 and a portion of the second insulating interlayer 32 disposed around the bottom electrode contact layer 34. The trench 69 may be filled with an insulating layer 38.

Referring to FIG. 18, an adhesive layer 40 may be formed on the first phase change layer 68 to cover the insulating layer 38. A top electrode 42 may be formed on the adhesive layer 40. A photoresist pattern 80 may be formed on the top electrode 42 to define a region in which a storage node may be formed. The top electrode 42, the adhesive layer 40, and the first phase change layer 68 may be sequentially etched using the photoresist pattern 80 as an etch mask. This etching process may be performed until the second insulating interlayer 32 is exposed. After the etching process is completed, the photoresist pattern 80 may be removed.

Because the processes performed until forming a bottom electrode contact layer 34 on a second insulating interlayer 32 may be the same as the processes of the above-described example embodiment, a detailed description of this example embodiment will begin with subsequent processes.

Figure 19:
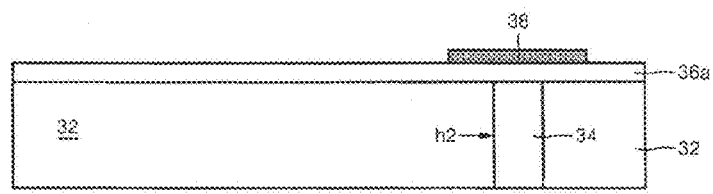
FIGS. 19 through 24 are cross-sectional views for partially illustrating a method of manufacturing a phase change memory device according to another example embodiment.

Referring to FIG. 19, a first phase change layer 36a may be formed on the second insulating interlayer 32. An insulating layer 38 may be formed on a first region of the first phase change layer 36a. In this example embodiment, the insulating layer 38 may be formed to the above-described thickness. The insulating layer 38 may have a central region corresponding to the bottom electrode contact layer 34 and may extend onto a portion of the second insulating interlayer 32 disposed around the bottom electrode contact layer 34.

Figure 20:
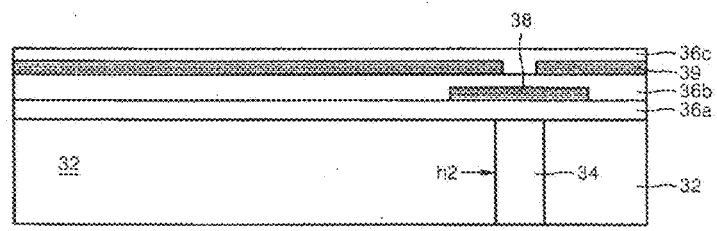

Referring to FIG. 20, a second phase change layer 36b may be formed on the first phase change layer 36a to cover the insulating layer 38, and a top surface of the second phase change layer 36b may be planarized. First insulating layers 39 may be formed on the planarized top surface of the second phase change layer 36b. The first insulating layers 39 may be formed spaced at intervals on the insulating layer 38. The interval between the first insulating layers 39 may be controlled within the range of the insulating layer 38. A third phase change layer 36c may be formed on the first insulating layers 39 to fill a space between the first insulating layers 39.

Figure 21:
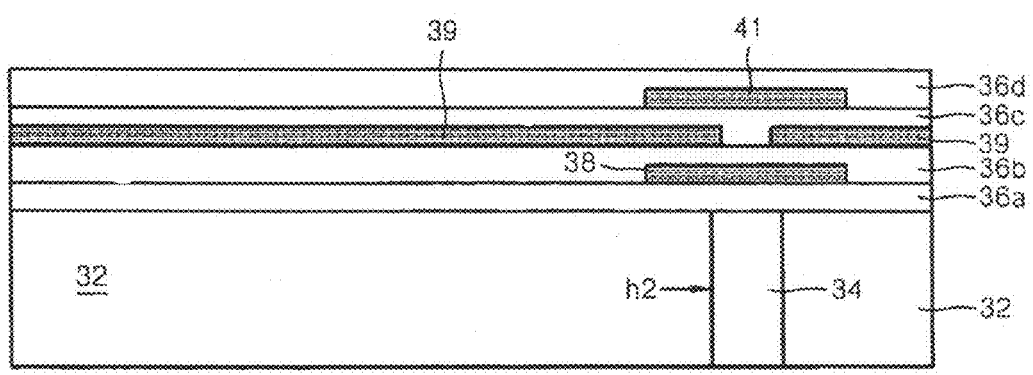

Referring to FIG. 21, a second insulating layer 41 may be formed on a region of the third phase change layer 36c. The second insulating layer 41 may be formed in the same shape and/or to the same thickness as the insulating layer 38. The second insulating layer 41 may be formed in a position corresponding to the position of the space between the first insulating layers 39. A fourth phase change layer 36d may be formed on the third phase change layer 36c to cover the second insulating layer 41, and a top surface of the fourth phase change layer 36d may be planarized.

Figure 22:
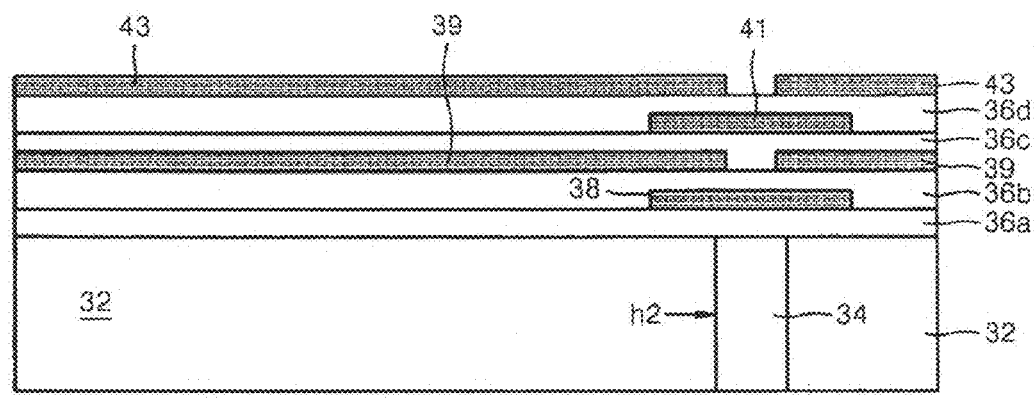

Referring to FIG. 22, third insulating layers 43 may be formed on the planarized top surface of the fourth phase change layer 36d. The third insulating layers 43 may be formed spaced at intervals, and a space between the third insulating layers 43 may be positioned over the second insulating layer 41. The space between the third insulating layers 43 may be controlled within the range of the second insulating layer 41. The insulating layer 38 and the first through third insulating layers 39, 41, and 43 may be formed of $SiO_2$ or other insulating material, for example, nitride or the like. The insulating layer 38 and the first through third insulating layers 39, 41, and 43 may be wholly or partially formed of different insulating materials. For example, the insulating layer 38 and the second insulating layer 41 may be formed of $SiO_2$ or the like, while the first and third insulating layers 39 and 43 may be formed of other insulating materials.

Figure 23:
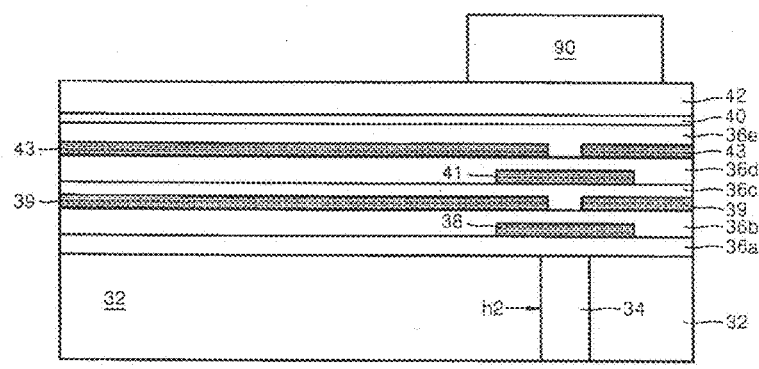

Referring to FIG. 23, a fifth phase change layer 36e may be formed on the third insulating layers 43 to fill a space between the third insulating layers 43, and a top surface of the fifth phase change layer 36e may be planarized. The first through fifth phase change layers 36a to 36e may be formed of the same phase change material, such as GST or other chalcogenide material. Alternatively, at least some of the phase change layers 36a through 36e may be formed of other phase change material than remaining phase change layers among 36a through 36e. An adhesive layer 40 and a top electrode 42 may be sequentially formed on the planarized top surface of the fifth phase change layer 36e. A photoresist pattern 90 may be formed on the top electrode 42 to define a region in which a storage node may be formed. In this example embodiment, the photoresist pattern 90 may be formed in a position for defining the insulating layer 38, the first and second phase change layers 36a and 36b disposed around the insulating layer 38, the second insulating layer 41 and the third and fourth phase change layers 36c and 36d disposed around the second insulating layer 41.

Considering a positional relationship between the insulating layer 38 and the first insulating layers 39 and a positional relationship between the second insulating layer 41 and the third insulating layers 43, the space between the first insulating layers 39 and its adjacent portions of the first insulating layers 39 and the space between the third insulating layers 39 and its adjacent portions of the third insulating layers 39 may be defined by the photoresist pattern 90.

Figure 24:
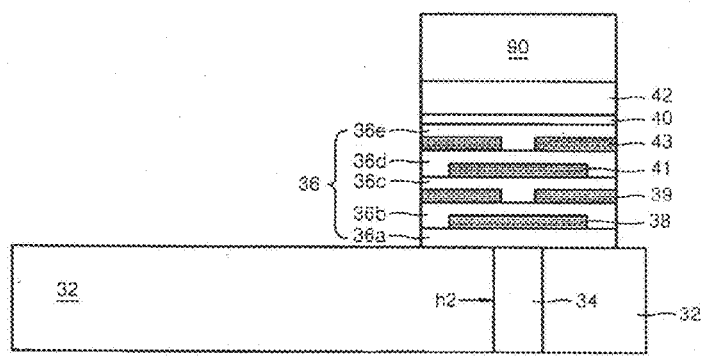

A stacked structure formed on the second insulating interlayer 32 may be sequentially etched using the photoresist pattern 90 as an etch mask. The etching process may be performed to expose the second insulating interlayer 32. As a result, as illustrated in FIG. 24, a stack structure including a phase change layer 36 having the first through fifth phase change layers 36a to 36e, the insulating layers 38, 39, 41, and 43, the adhesive layer 40, and the top electrode 42 may be formed on the bottom electrode contact layer 34 and a portion of the second insulating interlayer 32 disposed around the bottom electrode contact layer 34. In the stacked structure, the insulating layers 38, 39, 41, and 43 may be arranged to expand a current path between the bottom electrode contact layer 34 and the top electrode 42.

After the etching process is completed, the photoresist pattern 90 may be removed.

A method of operating the phase change memory device according to an example embodiment will now be described.

An example embodiment of a method of operating the phase change memory device shown in FIG. 1 will be described as an example. However, methods according to example embodiments may be also applied to other phase change memory devices such as those shown in FIGS. 3 through 5.

Referring again to FIG. 1, a first voltage higher than a threshold voltage may be applied to a gate electrode 19 such that a transistor remains turned on. An operating voltage may be applied between a top electrode 42 and a bottom electrode 30. In at least this example embodiment, the operating voltage may be a voltage for supplying a reset current (e.g., a write voltage). In another example embodiment, the operating voltage may be a voltage for supplying a set current (e.g., an erase voltage). In still another example embodiment, the operating voltage may be a voltage for supplying a current between the reset current and the set current (e.g., a read voltage).

As will be appreciated from the following simulation results, when the operating voltage is a write voltage, a reset current for changing a region between an insulating layer 38 and a bottom electrode contact layer 34 into an amorphous state may decrease smaller than in the conventional art.

When the operating voltage is a read voltage, a measured current flowing through the phase change layer 36 may be compared with a reference current. When the measured current is smaller than the reference current, a partial region of the phase change layer 36 disposed on a current path may be in an amorphous state. As a result, a data "1" may be written in the phase change memory device of FIG. 1. By contrast, when the measured current is larger than the reference current, a data "0" may be written in the phase change memory device of FIG. 1. Although data "1" and "0" have been described with regard to particular voltage levels, data may be read and/or written reversely.

An example simulation for showing a variation of a reset current for forming an amorphous region in a phase change layer according to an insulating layer included in the phase change layer of the phase change memory device according to an example embodiment and the temperature distribution obtained when the reset current is supplied was conducted.

Figure 25:
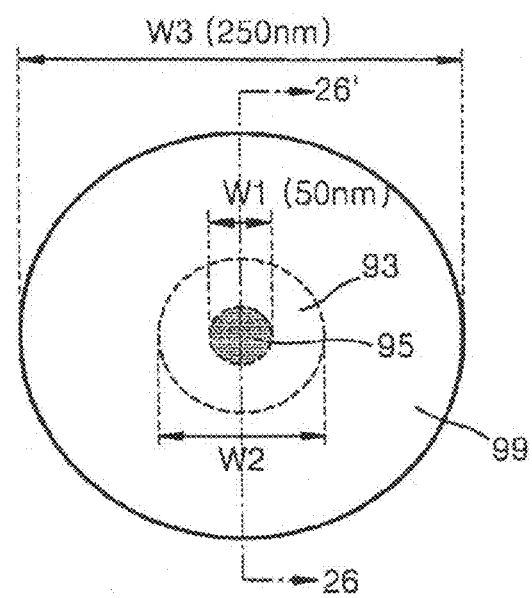
FIG. 25 is a plan view of a storage node used for a simulation of a phase change memory device according to an example embodiment.
Figure 26:
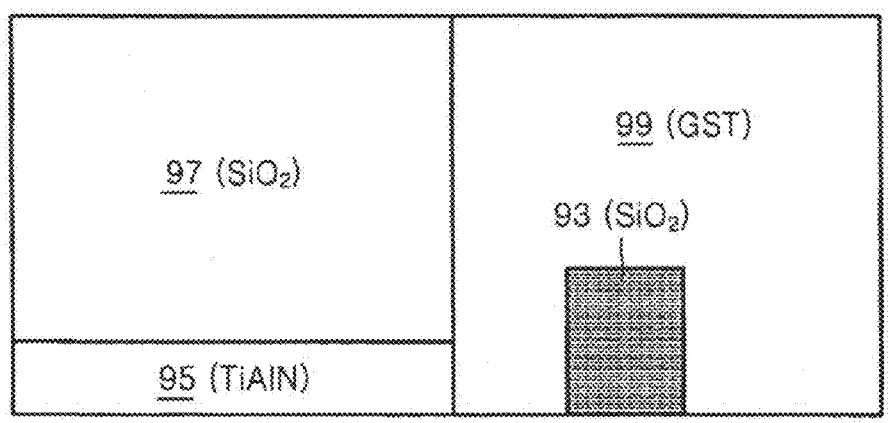
FIG. 26 illustrates a laid state of a left portion of a section taken along a direction 26-26' of FIG. 25.

FIG. 25 is a plan view of a storage node of the phase change memory device used in the simulation. FIG. 26 illustrates a portion of a section cut along a direction 26-26' of FIG. 25. The plan view of FIG. 25 is seen in the arrow direction in FIG. 26. FIG. 26 illustrates only an upper portion of the section of the laid resultant structure for the sake of clarity and convenience.

Referring to FIGS. 25 and 26, the phase change layer 99, an insulating layer 93, and a bottom electrode contact layer 95 were all processed as a cylindrical type during the simulation.

In the simulation, the phase change layer 99 was formed of GST, the bottom electrode contact layer 95 was formed of TiAlN, and the insulating layer 93 was formed of $SiO_2$. The reference numeral 97 denotes an insulating layer formed of $SiO_2$. The simulation was performed twice under different conditions.

In the first simulation, an interval between the insulating layer 93 and the bottom electrode contact layer 95 was maintained constant, and the insulating layer 93 was formed to have different diameters W2 of about 50 nm and about 100 nm, respectively.

For the second, a diameter W2 of the insulating layer 93 was fixed at a larger value than a diameter W1 of the bottom electrode contact layer 95, while an interval between the insulating layer 93 and the bottom electrode contact layer 95 was formed to different values of about 30 nm and about 10 nm, respectively.

In the two cases, a diameter W3 of the phase change layer 99 was fixed at about 250 nm, and the diameter W1 of the bottom electrode contact layer 95 was fixed at about 50 nm. Also, a conventional phase change memory device in which a phase change layer does not include an insulating layer was compared with the phase change memory devices according to example embodiments in the simulation.

FIGS. 27 through 31 are photographic images of simulation results showing a variation of a reset current and the temperature distribution of a phase change memory layer of the phase change memory devices according to example embodiments when an insulating layer is included in the phase change memory layer.

Figure 27:
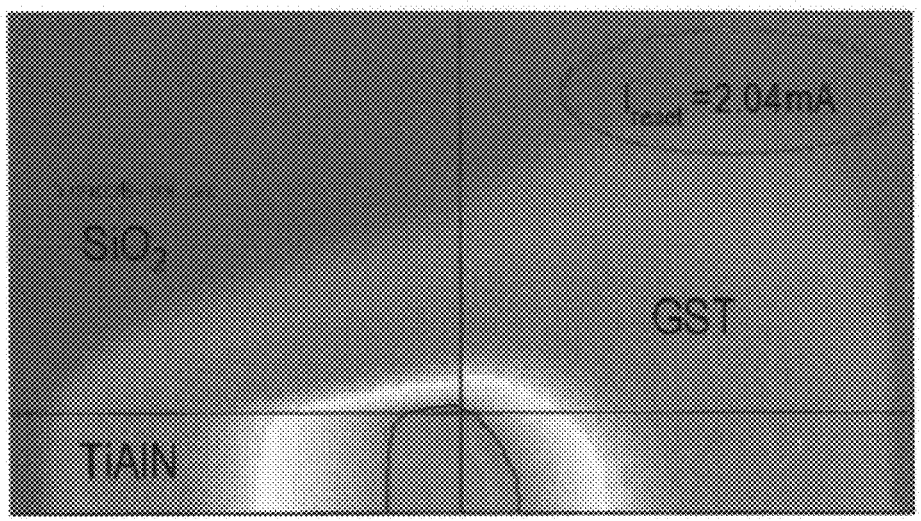
FIGS. 27 through 31 are photographic images of simulation results showing a variation of a reset current and the temperature distribution of a phase change memory layer of phase change memory devices according to example embodiments when an insulating layer is included in the phase change memory layer.
Figure 28:
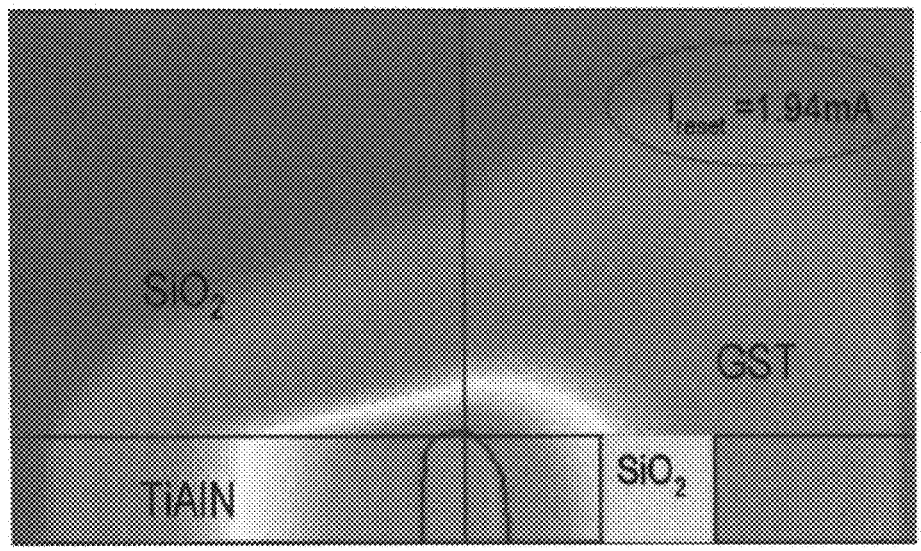
Figure 29:
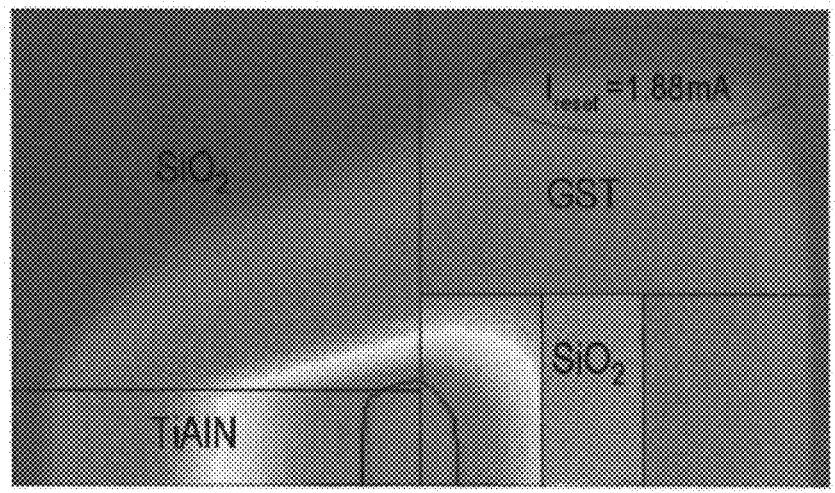

FIGS. 27 through 29 show results under the foregoing first conditions. FIG. 27 is a photographic image of simulation results of the conventional phase change random access memory (PRAM), while FIGS. 28 and 29 are photographic images of simulation results of the PRAM according to example embodiments. FIG. 28 shows a case where the diameter W2 of the insulating layer 93 was about 50 nm like the diameter W1 of the bottom electrode contact layer 95, and FIG. 29 shows a case where the diameter W2 of the insulating layer 93 was about 100 nm.

Referring to FIGS. 27 through 29, in the conventional PRAM and PRAMs according to example embodiments, a temperature measured in a region where the phase change layer 99 contacts the bottom electrode contact layer 95 was sufficiently raised so as to change the region into an amorphous region.

However, a reset current $I_{reset}$ of the conventional PRAM was 2.04 mA as shown in FIG. 27, while reset currents $I_{reset}$ of the PRAMs according to example embodiments were 1.94 mA and 1.88 mA, respectively, which are smaller than the reset current $I_{reset}$ of the conventional PRAM, as shown in FIGS. 28 and 29.

Even if the diameter W2 of the insulating layer 93 was equal or substantially equal to the diameter W1 of the bottom electrode contact layer 95, the reset current $I_{reset}$ of the PRAM according to example embodiments was smaller than that of the conventional PRAM. Also, when the insulating layer 93 is included in the phase change layer 99, as a difference between the diameter W2 of the insulating layer 93 and the diameter W1 of the bottom electrode contact layer 95 increased, the reset current $I_{reset}$ of the PRAM according to example embodiments decreased.

Figure 30:
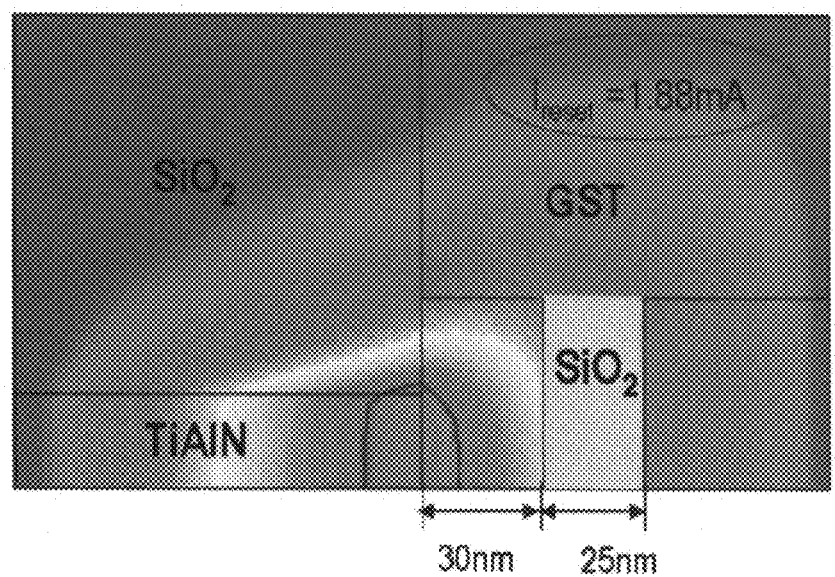
Figure 31:
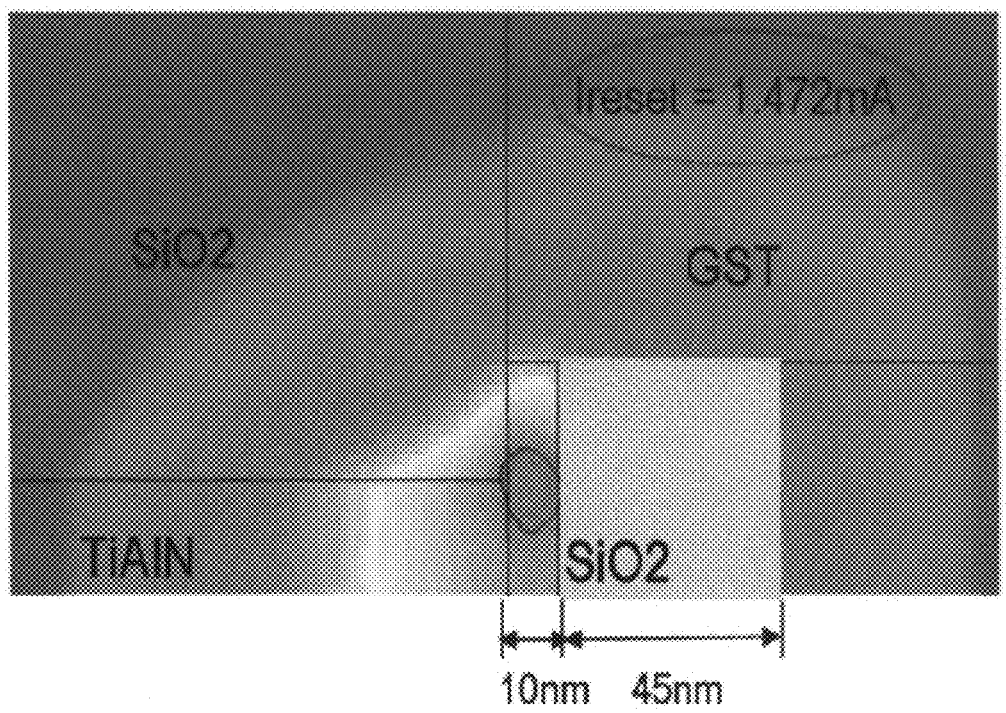

FIGS. 30 and 31 show results under the foregoing second conditions according to example embodiments. FIG. 30 shows a case where an interval between the insulating layer 93 and the bottom electrode contact layer 95 was about 30 nm, and FIG. 31 shows a case where the interval between the insulating layer 93 and the bottom electrode contact layer 95 was about 10 nm.

Referring to FIG. 30, when the diameter W2 of the insulating layer 93 was greater than the diameter W1 of the bottom electrode contact layer 95 and the interval between the insulating layer 93 and the bottom electrode contact layer 95 was 30 nm, the reset current $I_{reset}$ was 1.88 mA, and a region of the phase change layer 99 in contact with the bottom electrode contact layer 95 was completely changed into an amorphous region.

Referring to FIG. 31, when the diameter W2 of the insulating layer 93 was greater than the diameter W1 of the bottom electrode contact layer 95 and the interval between the insulating layer 93 and the bottom electrode contact layer 95 was about 10 nm, the reset current $I_{reset}$ was 1.472 mA, and only a region of the phase change layer 99 in contact with an edge of the bottom electrode contact layer 95 was changed into an amorphous region.

From the results of FIGS. 30 and 31, when the diameter W2 of the insulating layer 93 was greater than the diameter W1 of the bottom electrode contact layer 95, as the interval between the insulating layer 93 and the bottom electrode contact layer 95 decreased, the reset current $I_{reset}$ decreased, and a smaller region of the insulating layer 93 in contact with the edge of the bottom electrode contact layer 95 was changed into an amorphous region.

As described above, the phase change memory device according to example embodiments include an insulating layer disposed in the phase change layer opposite to the bottom electrode contact layer. Due to the insulating layer, a program volume of the phase change layer changed into an amorphous region may narrow, and current density may increase in the program volume. As a result, the program volume may change into the amorphous region with a smaller current than in the conventional art.

Also, a current path between the bottom electrode contact layer and the top electrode may expand due to the insulating layer. Thus, a resistance in the current path may increase, so that the amorphous region may form in the phase change layer using a smaller reset current than in the conventional art.

Therefore, the reset current of the phase change memory device according to example embodiments may be further reduced by considering both a reduction in the program volume and an increase in the current path.

According to example embodiments, a phase change memory device may reduce reset current due to the insulating layer included in the phase change layer. The reset current of the phase change memory device may be further reduced by controlling the diameter of the insulating layer and a positional relationship between the bottom electrode contact layer and the insulating layer. As a result, the integration density of the phase change memory device may increase.

The insulating layer included in the phase change layer may suppress, prevent and/or cut off the transmission of heat from the external environment into the program volume (e.g., the amorphous region) of the phase change layer. Therefore, the phase change memory device according to example embodiments may prevent data from being changed and/or lost due to external heat. In other words, the reliability of the phase change memory device according to example embodiments may be maintained constant in a relatively poor external environment characterized, for example, in relatively high temperatures.

In example embodiments, the phase change layers may include phase change materials, for example, chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the phase change material may be made of a transition metal oxide having multiple resistance states, as described above. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_1$-$xMnO_3$). The phase change material may be a chemical compound including one or more elements selected from the group consisting of S, Se, Te, As, Sb, Ge, Sn, In and Ag.

While example embodiments have been particularly shown and described with reference to the example embodiments shown in the figures, it will be understood by those of ordinary skill in the art that various changes in form and details may be made therein without departing from the spirit and scope of the present invention as defined by the following claims.

What is claimed is:

1. A phase change memory device comprising:
a switching device; and
a storage node connected to the switching device; wherein the storage node includes,
- a bottom stack having a first cross-sectional length,
- a phase change layer disposed on and in contact with the bottom stack, and
- a top stack disposed on the phase change layer, wherein the phase change layer includes a current path increase unit having a second cross-sectional length, the current path increase unit being configured to increase a path of current flowing through the phase change layer, and the second cross-sectional length being greater than the first cross-sectional length, and
- the phase change layer covers a top surface and a bottom surface of the current path increase unit.

2. The phase change memory device of claim 1, wherein an area of the bottom surface of the current path increase unit is greater than an area of a top surface of the bottom stack.

3. The phase change memory device of claim 2, wherein a total area of the bottom surface of the current path increase unit facing the bottom stack is greater than a total area of the top surface of the bottom stack in contact with the phase change layer.

4. The phase change memory device of claim 1, wherein the phase change layer covers an entirety of the top surface of the current path increase unit.

5. The phase change memory device of claim 1, wherein the phase change layer covers an entirety of the bottom surface of the current path increase unit.

6. The phase change memory device of claim 1, wherein the phase change layer covers an entirety of the top surface and an entirety of the bottom surface of the current path increase unit.

7. The phase change memory device of claim 1, wherein the phase change layer surrounds the entire current path increase unit.

8. The phase change memory device of claim 1, wherein the phase change layer covers the entire top, bottom and side surfaces of the current path increase unit.

9. The phase change memory device of claim 1, wherein the current path increase unit is a material layer having a lower electric conductivity than an amorphous region of the phase change layer.

10. The phase change memory device of claim 9, wherein the material layer is an insulating layer.

11. A phase change memory device comprising:
a switching device; and
a storage node connected to the switching device; wherein the storage node includes,
- a bottom stack having a first cross-sectional length,
- a phase change layer disposed on and in contact with the bottom stack, and
- a top stack disposed on the phase change layer, wherein the phase change layer includes a current path increase unit having a second cross-sectional length, the current path increase unit being configured to increase a path of current flowing through the phase change layer, and the second cross-sectional length being greater than the first cross-sectional length, and
- the current path increase unit is separated from the bottom stack and the top stack by portions of the phase change layer.

12. The phase change memory device of claim 11, wherein an area of a bottom surface of the current path increase unit is greater than an area of a top surface of the bottom stack.

13. The phase change memory device of claim 12, wherein a total area of the bottom surface of the current path increase unit facing the bottom stack is greater than a total area of the top surface of the bottom stack.

14. The phase change memory device of claim 11, wherein the phase change layer surrounds the current path increase unit.

15. The phase change memory device of claim 11, wherein the phase change layer covers top, bottom and side surfaces of the current path increase unit.

16. The phase change memory device of claim 11, wherein the current path increase unit is a material layer having a lower electric conductivity than an amorphous region of the phase change layer.

17. The phase change memory device of claim 16, wherein the material layer is an insulating layer.

* * * * *